United States Patent
Chang

(10) Patent No.: US 6,362,996 B2
(45) Date of Patent: Mar. 26, 2002

(54) TERMINATING CIRCUIT MODULE USED IN A COMPUTER SYSTEM

(75) Inventor: Nai-Shung Chang, Taipei Hsien (TW)

(73) Assignee: Via Technologies, Inc., Taipei Hsien (TW)

( * ) Notice: Subject to any disclaimer, the term of this patent is extended or adjusted under 35 U.S.C. 154(b) by 0 days.

(21) Appl. No.: 09/761,944

(22) Filed: Jan. 17, 2001

Related U.S. Application Data

(60) Provisional application No. 60/177,906, filed on Jan. 25, 2000.

(30) Foreign Application Priority Data

Jul. 5, 2000 (TW) .......................................... 89113314

(51) Int. Cl.$^7$ ................................................ G11C 5/02
(52) U.S. Cl. ......................................... 365/52; 365/226
(58) Field of Search ........................ 365/52, 63, 189.11, 365/226, 58

(56) References Cited

U.S. PATENT DOCUMENTS

| | | | | |
|---|---|---|---|---|
| 5,706,445 A | * | 1/1998 | Milhaupt et al. | 395/280 |
| 5,867,417 A | * | 2/1999 | Wallace et al. | 365/52 |
| 5,877,975 A | * | 3/1999 | Jigour et al. | 365/52 |

* cited by examiner

Primary Examiner—David Nelms
Assistant Examiner—Thong Le
(74) Attorney, Agent, or Firm—J.C. Patents

(57) ABSTRACT

A terminating circuit module and a computer system using the same, in which a voltage regulator and a plurality of pull-up resistors can be provided on the terminating circuit module by the mainboard producer to reduce the area of the printed circuit board of the mainboard. Also, a nonvolatile memory can be provided on the terminating circuit module to store the information representing such terminating circuit module. The computer can automatically read the configuration of the memory and the terminating circuit module such as the slotted positions for the terminating circuit module and the memory module to prevent users from using the terminating circuit module in an incorrect way.

15 Claims, 2 Drawing Sheets

TERMINATING CIRCUIT MODULE USED IN A COMPUTER SYSTEM

CROSS-REFERENCE TO RELATED APPLICATION

This application claims the priority benefit of U.S.A. application Ser. No. 60/177,906, filed Jan. 25, 2000, and the priority benefit of Taiwan application serial no. 89113314, filed Jul. 5, 2000.

BACKGROUND OF INVENTION

1. Field of Invention

The present invention relates to a personal computer system, especially to a terminating circuit module for automatic detection and a computer system that can automatically detect the terminating circuit module on the memory module slots.

2. Description of Related Art

A standard PC consists of a mainboard, interface card, and peripheral equipment, in which the mainboard is the heart of the computer system. On the mainboard, additional to the CPU, chip set, and slots for interface cards, a plurality of memory module slots for memory modules can also be provided. The number of memory module slots is varied as desired. A memory module set includes a plurality of memory members.

In the memory used in PC's, such as synchronous dynamic random access memory (SDRAM), the access operation of the information is controlled by properly responding to a rising edge the clock signal in the system. Further, there is a double data rate DRAM (DDR DRAM), in which the memory is operated in the double data rate mode. The information access operation is controlled by the rising edge and the falling edge of the clock signal in the system to increase the speed of the memory.

The differences between SDRAM and DDR DRAM is described as following: (1) a normal clock signal is used in SDRAM and a differential clock signal is used in DDR DRAM; (2) $V_{DD}$ for SDRAM is equal to 3.3 V, and $V_{DD}$ for DDR DRAM is equal to 2.5 V, where $V_{DDQ}$ is also set to 2.5 V; (3) a reference is needed for SDRAM, but it is not needed for DDR DRAM, and the reference voltage thereof is ½ of $V_{DDQ}$; (4) the information bus connected to SDRAM is a standard CMOS logic, and the information bus connected to DDR DRAM is a series stub terminated logic 2 (SSTL_2); (5) a terminating voltage ($V_{TT}$) is not needed for the SDRAM, and a $V_{TT}$ terminating voltage is needed for the information bus connected to DDR DRAM to absorb the reflected electric wave; (6) a pull-up resistor (or called a terminating resistor) is not needed for the information bus connected to SDRAM, but it is needed for the information bus connected to DDR DRAM. DDR DRAM has a greater advantage over SDRAM because of its double data rate.

Some chip sets in the commercially available mainboards support both SDRAM DRAM and DDR DRAM. However, only one memory module, such as SDRAM memory module or DDR DRAM memory module, can be used in the mainboard fabrication. This is because the information bus connected to DDR DRAM is a series stub terminated logic 2 (SSTL_2). Therefore, a voltage regulator for $V_{TT}$ terminating voltage and a plurality of pull-up resistors are needed to be provided on the mainboard for DDR DRAM to absorb the reflected electric wave. Only one process for fabrication can be chosen, even if the chip set can support the SDRAM/DDR DRAM memory modules. For example, a mainboard supporting SDRAM and a mainboard supporting DDR DRAM can not be used together. Accordingly, the performance of the chip set can not be exhibited totally. When the mainboard supporting DDR DRAM is fabricated, components such as a voltage regulator and a plurality of pull-up resistors need to be provided on the mainboard. The used area of the printed circuit board (PCB) in the mainboard thus increases, resulting in increase of cost for the mainboard.

SUMMARY OF INVENTION

The present invention provides a terminating circuit module used in a computer system, in which a voltage regulator and a plurality of pull-up resistors can be provided on the terminating circuit module by the mainboard producer to reduce the area of the printed circuit board of the mainboard. Also, a nonvolatile memory can be provided on the terminating circuit module to store the information related to the terminating circuit module. The computer can automatically read the configuration of the memory and the terminated circuit module to prevent users from using the terminating circuit module in an incorrect way. A computer system, in which the SDRAM or DDR DRAM memory module can alternatively be used, can be further produced by the computer producer.

The present invention provides a terminating circuit module that can be applied on the mainboard of the computer system. The mainboard has a plurality of memory module slots each having a plurality of signal lines. The terminating circuit module comprises a printed circuit board which can be put into one of the memory module slots to electrically connect the terminating circuit module to the memory module slots. A voltage regulator is provided on the above printed circuit board to provide a terminating voltage. A plurality of terminating resistors are coupled to the voltage regulator, which are also provided on the printed circuit board. nonvolatile memory provided on the printed circuit board. Each of these terminating resistors has one end connected to the above signal lines and the other end connected to the above terminating voltage. When such terminating module is put into one of the memory module slots, the mainboard receives the configuration information of such terminating circuit module thereon by reading the information in the nonvolatile memory.

According to one of the preferred embodiments of the present invention, the information in the above nonvolatile memory corresponds to the specification of SPD, and the hardware thereof is associated with EEPROM. The memory module slots are the memory module slots satisfying the specification of JEDEC standard 184 pins. These memory module slots further include reference voltage pins, in which such reference voltage satisfies the standard of SSTL_2 bus in JEDEC specification.

According to one of the preferred embodiments of the present invention, the configuration information of the memory in the computer system, such as the slotted positions of the terminating circuit module and the memory, can be detected automatically by using the computer system according to the present invention to prevent users from using the terminating circuit module in an incorrect way.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principle of the invention. In the drawings.

DESCRIPTION OF THE PREFERRED EMBODIMENTS

Figure 1:
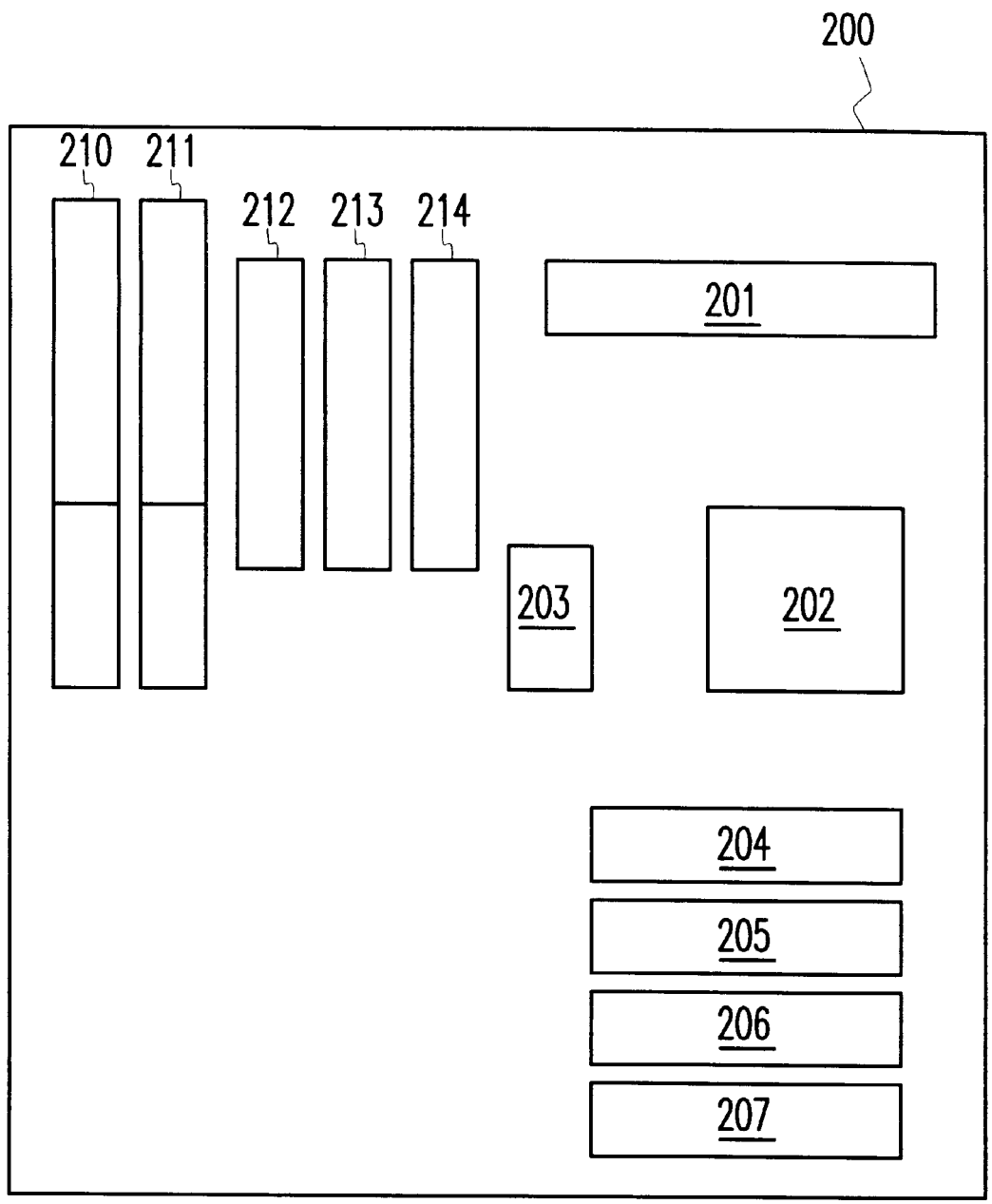
FIG. 1 shows a schematic layout of a computer system according to one preferred embodiment of the present invention, which has a mainboard having a plurality of memory module slots thereon.

Referring to FIG. 1, a computer system according to one preferred embodiment of the present invention, which has a mainboard having a plurality of memory module slots thereon, is shown. The mainboard of this example is a mainboard supporting the SDRAM/DDR DRAM memory module. The mainboard of this example includes a CPU slot 201, a chip set 202, a differential clock generating device 203, a plurality of memory module slots 204–207, a plurality of PCI slots 212–214 and a plurality of ISA slots 210–211. The chip set 202 of this example provides the ability of being supported by the SDRAM and DR DRAM) which is used as desired. The differential clock generating device 203 can generate the differential clock signal required for the DDR DRAM memory module or the normal clock signal required for SDRAM according to the memory module used.

Figure 2:
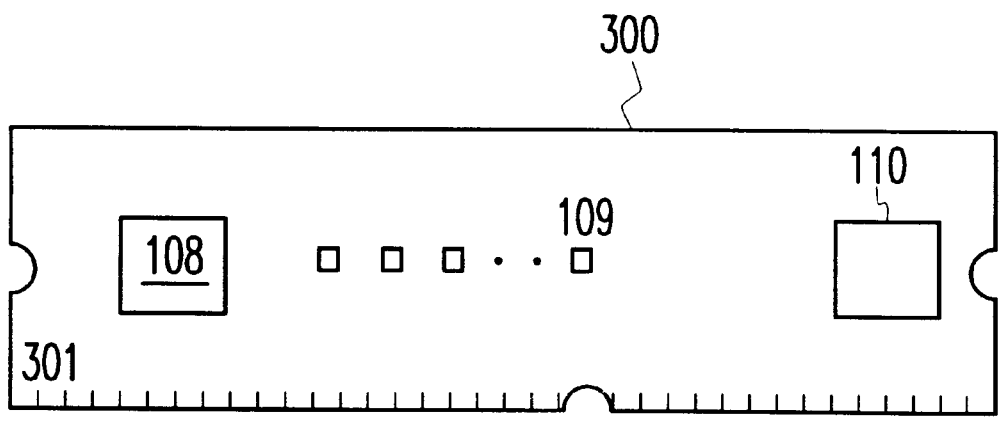
FIG. 2 shows a schematic layout of one of the terminating circuit modules of the present invention, in which a voltage regulator and a plurality of the terminating resistors are provided on the mainboard.

FIG. 2 shows a schematic layout of one of the terminating circuit modules of the present invention, in which a voltage regulator and a plurality of the terminating resistors are provided on the mainboard. Referring to FIG. 2, a plurality of terminating resistors 109 and a plurality of regulators 108 are provided on the terminating circuit module 300 out of the mainboard 200. Also, a nonvolatile memory 110 is provided thereon and has configuration information corresponding to the serial presence detection (SPD) specification. When the DDR DRAM memory module is used, such terminating circuit module 300 is inserted in one of the memory module slots 204–207. When SDRM memory module is used, such terminating circuit module 300 is not inserted. Therefore, not only the area of the circuit board is reduced, but also the computer system of the present invention has a greater range of application.

Figure 3:
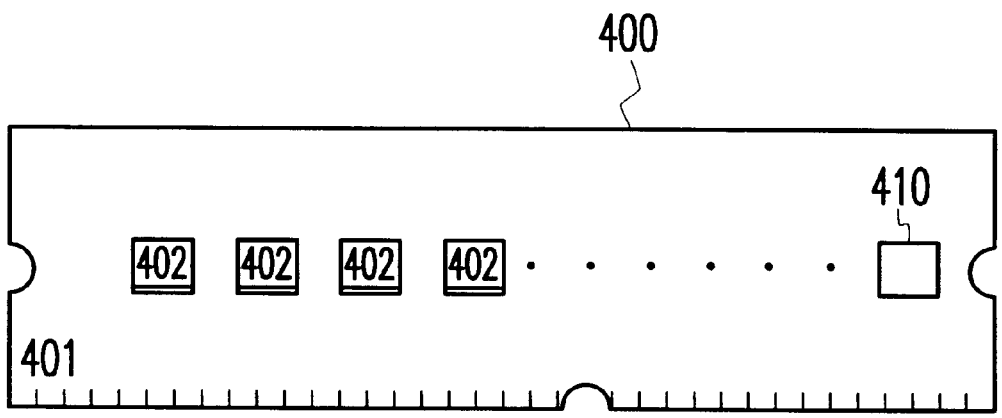
FIG. 3 shows a schematic layout of the memory module for one of the computer systems according to the present invention.

FIG. 3 shows a schematic layout of the memory module for one of the computer systems according to the present invention. Such memory module 400 that can be used in the mainboard 200 includes a printed circuit board 401 which can be inserted in the memory module slots 204–207; a nonvolatile memory 410 which can store the configuration information corresponding to SPD specification; and a plurality of DDR DRAMs 402 provided on the printed circuit board 401.

Referring to FIGS. 1 and 2, the terminating circuit module 300 provided by the present invention can be used in the mainboard 200 of the computer system. Such mainboard 200 has a plurality of memory module slots 204–207 each having a plurality of signal lines. Such terminating circuit module 300 comprises a printed circuit board 301 which can be put into one of the memory module slots to electrically connect the terminating circuit module 300 to the memory module slots 204–207; a voltage regulator 108 provided on the above printed circuit board 301 to provide the terminating voltage; a plurality of terminating resistors 109 coupled to the voltage regulator 108, which are also provided on the printed circuit board 301; and a nonvolatile memory 110, such as EEPROM, which is provided on the printed circuit board 301. Each of these terminating resistors 109 has one end connected to the above signal lines and other end connected to the above terminating voltage. When such terminating module 300 is put into one of the memory module slots 204–207, the mainboard 200 receives the configuration information of such terminating circuit module 300 thereon by reading the SPD information in the nonvolatile memory.

All of the memory module slots 204–207 have reference voltage pins that are connected in parallel on the mainboard 200 of this example. When the terminating circuit module 300 is put into one of the memory module slots 204–207, the voltage regulator 108 provides a reference voltage to the reference voltage pins with a range satisfying the specification of SSTL_2 bus in the JEDEC standard, . The differential clock generating device 203 of the mainboard 200 is coupled to the reference voltage pins of the memory module slots 204–207) so as to detect whether the voltage on these reference voltage pins is corresponding to the reference voltage or not. If it is, a differential clock signal is generated. If it is not, a normal clock signal is generated.

The chip set 202 in the mainboard 200 of this example is coupled to an output voltage of the differential clock generating device 203. When the voltage matches to the reference voltage, the chip set 202 operates in double data rate mode (DDR mode) to access the DDR memory module. When the voltage does not match to the reference voltage, the chip set 202 operates in normal mode to access the SRDAM memory module. The memory module slots 204–207 are the memory module slots satisfying the specification of JEDEC standard 184 pins. The reference voltage satisfies a range required in JEDEC standard for the SSTL_2 bus. The reference voltage is such as 1.25 V However, the reference voltage is not limited by the value. It is apparent to those skilled in the art that various modifications and variations can be made to the structure of the present invention without departing from the scope or spirit of the invention.

As known in the art, the above structure can realize the function of automatic detection, which can be designed to be operated manually, for example by an ON/OFF SWITCH, so that the chip set 202 and differential clock generating device 203 can be directly set to support DDR DRAM or SDRAM. This preferred embodiment is exemplified by support of DDR DRAM and SRDRAM. If the present invention incorporates a memory in other forms, the reference voltage may not necessarily be included. If the voltage source provided by the present invention meets the requirement for the reference voltage and the terminating voltage, the voltage regulator may not necessarily be included in the terminating circuit module according to the present invention.

Referring to FIGS. 1, 2 and 3, the present invention provides a computer system, which comprises a mainboard 200 having a plurality of memory module slots 204–207, each of the memory module slots 204–207 having a plurality of signal lines. Furthermore, a memory module 400 is inserted in one of the memory module slots 204–207 to be the main memory for such computer system. A terminating circuit module 300 is inserted in one of the memory module slots 204–207. Such terminating circuit module 300 has the same structure as the above module, such that the description therefor is not needed.

One of the characteristics according to the present invention is that the mainboard 200 of such computer system can obtain the configuration information of such terminating circuit module 300 thereon by reading the information, such as the SPD information, in the nonvolatile memory 110, 410. For example, the slotted positions of the terminating circuit module 300 and the memory module 400 can be known to prevent users from using the terminating circuit module in an incorrect way. For example, if one inserts the terminating circuit module between the memory modules, it may cause instability of the transition circuit, or even shutting-down.

The memory module slots 204–207 in the above example are the memory module slots corresponding to the specification of JEDEC standard 184 pins. As known in the art, other memory module slots such as memory module slots having 168 pins or 228 pins can be used, as long as they have sufficient amount of pins for signal lines.

It will be apparent to those skilled in the art that various modifications and variations can be made to the structure of the present invention without departing from the scope or spirit of the invention. In view of the forgoing, it is intended that the present invention cover modifications and variations of this invention provided they fall within the scope of the following claims and their equivalents.

What is claimed is:

1. A terminating circuit module that can be applied on a mainboard of a computer system, wherein the mainboard has a plurality of memory module slots, each having a plurality of signal pins, the terminating circuit module comprising:

a printed circuit board which can be plugged into one of the memory module slots to electrically connect the terminating circuit module to the memory module slots;

a voltage regulator provided on the printed circuit board to provide a terminating voltage;

a plurality of terminating resistors coupled to the voltage regulator, wherein the terminating resistors are also provided on the printed circuit board, each of the terminating resistors having a first end connected to the signal pins and a second end connected to the terminating voltage; and a nonvolatile memory provided on the printed circuit board, in which when such terminating module is plugged into one of the memory module slots, the mainboard obtains configuration information of the terminating circuit module thereon by reading information in the nonvolatile memory.

2. The terminating circuit module as claimed in claim 1, wherein the information in the nonvolatile memory conforms to the serial presence detection (SPD) specification.

3. The terminating circuit module as claimed in claim 1, wherein the nonvolatile memory comprises EEPROM.

4. The terminating circuit module as claimed in claim 1, wherein the memory module slots conforms to the JEDEC standard specification with 184 pins, and the memory module slots include a reference voltage pin, in which when the terminating circuit module is plugged into one of the memory module slots, the voltage regulator provides a reference voltage to the reference voltage pin within a voltage range satisfying requirements in the JEDEC standard specification for an SSTL_2 bus.

5. The terminating circuit module as claimed in claim 1, wherein the memory module slots comprise 168-pin memory module slots.

6. A terminating circuit module that can be provided on a mainboard of a computer system, wherein the mainboard has a plurality of memory module slots, each having a plurality of signal lines, the terminating circuit module comprising:

a printed circuit board which can be plugged into one of the memory module slots to electrically connect the terminating circuit module to the memory module slots; and a plurality of terminating resistors provided on the printed circuit board, each of the terminating resistors having a first end connected to the signal lines and a second end connected to a terminating voltage.

7. The terminating circuit module as claimed in claim 6, further comprising:

a nonvolatile memory provided on the printed circuit board, in which when the terminating module is put into one of the memory module slots, the mainboard obtains configuration information of the terminating circuit module thereon by reading information in the nonvolatile memory.

8. The terminating circuit module as claimed in claim 7, wherein the information in the nonvolatile memory conforms to the serial presence detection (SPD) specification.

9. The terminating circuit module as claimed in claim 8, wherein the nonvolatile memory comprises EEPROM.

10. A computer system, comprising:

a mainboard which comprises a plurality of memory module slots each having a plurality of signal lines;

a memory module which can be plugged in one of the memory module slots to serve as a memory for the computer system;

a terminating circuit module which can be plugged in one of the memory module slots, the terminating module comprising:

a printed circuit board which can be plugged into one of the memory module slots to electrically connect the terminating circuit module to the memory module slots;

a voltage regulator provided on the printed circuit board to provide a terminating voltage; and a plurality of terminating resistors coupled to the voltage regulator, wherein the terminating resistors are also provided on the printed circuit board, each of the terminating resistors having one end connected to the signal lines and another end connected to the terminating voltage.

11. The computer system as claimed in claim 10, wherein the terminating circuit module further comprises:

a nonvolatile memory provided on the printed circuit board, in which when the terminating module is plugged into one of the memory module slots, the mainboard obtains configuration information of the terminating circuit module thereon by reading information in the nonvolatile memory.

12. The computer system as claimed in claim 11, wherein the information in the nonvolatile memory conforms to the SPD specification.

13. The computer system as claimed in claim 12, wherein the nonvolatile memory comprises EEPROM.

14. The computer system as claimed in claim 10, wherein the memory module slots conform to the JEDEC standard specification with 184 pins, and the memory module slots further include a reference voltage pin, in which when the terminating circuit module is plugged in one of the memory module slots, said voltage regulator provides a reference voltage to the reference voltage pin with a range satisfying the requirements of the JEDEC standard specification for an SSTL_2 bus.

15. The terminating circuit module as claimed in claim 10, wherein the memory module slots are 168-pin memory module slots.

* * * * *